Dec. 9, 1969 H. ERLER ET AL 3,483,483

TRANSISTOR OSCILLATOR WITH STRIP-CONDUCTOR INTERSTAGE COUPLING

Filed Sept. 20, 1967 6 Sheets-Sheet 1

INVENTORS:
HEINZ ERLER
BERNHARD REHER
BY HARTWIG HOPP

Karl F. Ross
ATTORNEY

INVENTORS:
HEINZ ERLER
BERNHARD REHER
BY HARTWIG HOPP
Karl F. Ross
ATTORNEY

INVENTORS:
HEINZ ERLER
BERNHARD REHER
HARTWIG HOPP
BY Karl G. Ross
ATTORNEY

INVENTORS:
HEINZ ERLER
BERNHARD REHER
HARTWIG HOPP
BY
Karl F. Ross
ATTORNEY

INVENTORS:
HEINZ ERLER
BERNHARD REHER
BY HARTWIG HOPP
Karl F. Ross
ATTORNEY

TRANSISTOR OSCILLATOR WITH STRIP-CONDUCTOR INTERSTAGE COUPLING

Filed Sept. 20, 1967 6 Sheets-Sheet 6

INVENTORS:
HEINZ ERLER
BERNHARD REHER
HARTWIG HOPP
BY
Karl G. Ross
ATTORNEY 3,483,483
TRANSISTOR OSCILLATOR WITH STRIP-CONDUCTOR INTERSTAGE COUPLING Heinz Erler, Stassfurt, Bernhard Reher, Aschersleben, and Hartwig Hopp, Loderburg, Germany, assignors to VEB Fernsehgeratewerke Stassfurt, Stassfurt, Germany, a corporation of Germany Filed Sept. 20, 1967, Ser. No. 669,191
Int. Cl. H03b *5/18, 7/12*
U.S. Cl. 331—99 7 Claims

ABSTRACT OF THE DISCLOSURE

On a sheet of dielectric material, provided on opposite sides with electrically coupled metallic layers of which at least one is subdivided into strip conductors, one or more three-dimensional circuit elements (e.g. impedances and/or transistors) of a two-stage transistor oscillator are physically supported in electrically coupled relationship with at least one of the layers, as by being accommodated in respective cutouts of the sheet.

Specification

Our present invention relates to printed circuitry and, more particularly, to a network which includes such circuitry in combination with one or more solid, three-dimensional circuit elements of conventional type.

The general object of our invention is to provide a circuit arrangement of this character which is highly compact and easy to manufacture on a mass-production basis.

A more particular object of our invention is to provide simple means in such circuit arrangement for modifying the reactances of certain constituents thereof, e.g. for tuning purposes, or to vary the coupling factor between two reactively coupled circuits.

Broadly speaking, a high-frequency network according to our invention comprises a dielectric sheet provided with a metallic layer on at least one surface, there being preferably two such layers on opposite sheet surfaces; the layers, or at least one of them, are subdivided in a manner known per se into conductive strip zones and are electrically coupled to one or more three-dimensional circuit elements which are physically supported by the sheet and removably mounted thereon. These elements may include lumped impedances, such as resistors, condensers, inductances or rectifiers, as well as transistors and other crystal-type semiconductors.

In a particularly advantageous embodiment, the dielectric sheet is formed with one or more cutouts which accommodate respective three-dimensional elements in such a way that a housing or envelope of any element and/or some electrode thereof is connected to one of the layers (one of which may be grounded) either directly or through a further removable circuit element. Thus, the basic network structure may be mass-produced by well known printed-circuit techniques, with the conductive layers applied by spraying, calendering, vapor deposition and so forth, followed or preceded by a punching of the sheet to provide the necessary cutouts. There are, however, certain instances in which a three-dimensional circuit element supported by the dielectric sheet need not be placed in a cutout. Thus, for example, a wire loop designed to interconnect two of the strip zones may be formed as a clip whose pointed ends penetrate one of the metal layers at selected locations to engage the underlying support sheet.

Other optional but advantageous features of the system according to our invention include a metal foil overlying one of the layers alongside a strip zone thereof so as partly to overlap that zone for the purpose of modifying its effective reactance; a flexible metallic tab on the dielectric sheet overhanging one of the strip zones in capacitively coupled relationship therewith to act as an adjustable trimming condenser; and a conductive connection passing through a slot in the dielectric sheet between corresponding points of the two metal layers to form a supplemental ground leak which, according to its selected position within the slot, varies the effective ground impedance at, say, the junction point of the conductors of a quarter-wavelength or a half-wavelength strip line formed by one of the upper layers.

The above and other features of our invention will become more fully apparent from the following detailed description, reference being made to the accompanying drawing in which.

Figure 1:
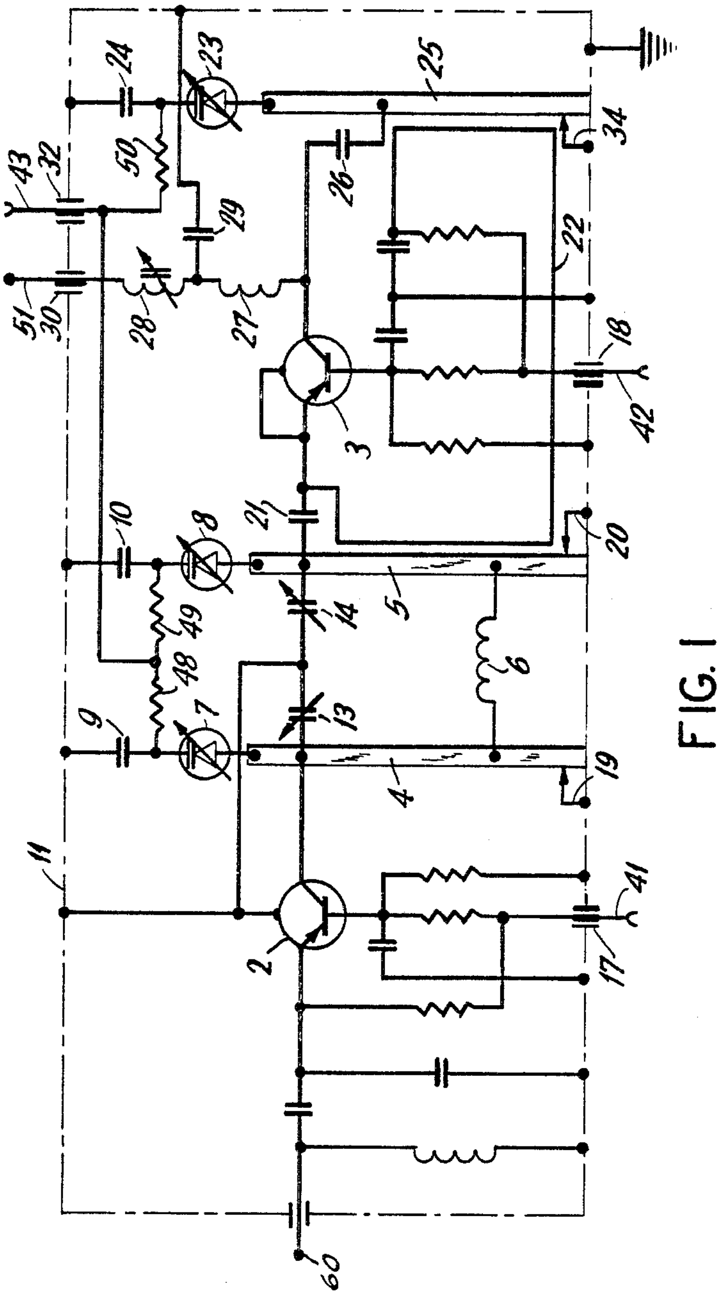
FIG. 1 is the equivalent circuit diagram of a printed network embodying our invention.

Reference will first be made to FIG. 1 which shows a high-frequency oscillator comprising a first transistor stage 2 and a second transistor stage 3, the collector circuit of transistor 2 including a conductor strip 4 which is coupled through a common ground bus bar 11 and a bridging inductance 6 to a similar strip 5 in the emitter circuit of transistor 3. This emitter circuit also comprises a loop 22 having a portion closely juxtaposed with strip 5 for inductive coupling therewith; a similar strip 25 in the collector circuit of transistor 3 is coupled in like manner with another portion of loop 22 to provide regenerative feedback between the input and the output of stage 3, thereby generating oscillations at a frequency determined by the effective loop impedance. Owing to the extent of bus bar 11, its junctions with strips 4, 5 and 25 are not exactly at ground potential for high-frequency currents and the effective ground impedance of these junctions may be varied by short circuits 19, 20 and 34 as more fully described hereinafter. Transistor stage 2 has an input terminal 60 for the application of a signal to modulate, in the well-known manner, the oscillations generated by transistor stage 3.

Each of strips 4, 5 and 25 terminates in a respective varactor 7, 8, 23 followed by a respective foreshortening condenser 9, 10, 24. The hot ends of strips 4 and 5 are connected to ground via respective trimming condensers 13, 14. The impedance of the varactors 7, 8 and 23 is controlled from a suitable voltage source, not shown, via a lead 43 by way of respective resistors 48, 49 and 50, this voltage source also supplying the collector current for transistor 2. The collector of transistor 3 is energized, from another voltage source not shown, by way of a lead 51 in series with an adjustable low-pass filter including series inductances 27, 28 and a shunt capacitance 29. Biasing voltages are supplied to the bases of transistors 2 and 3 by way of respective leads 41 and 42. Leads 41, 42, 51 and 43 are grounded for high-frequency currents by way of respective condensers 17, 18, 30 and 32. FIG. 1 also shows several coupling condensers 21, 26 in addition to other impedances associated with transistors 2 and 3.

Figure 2:
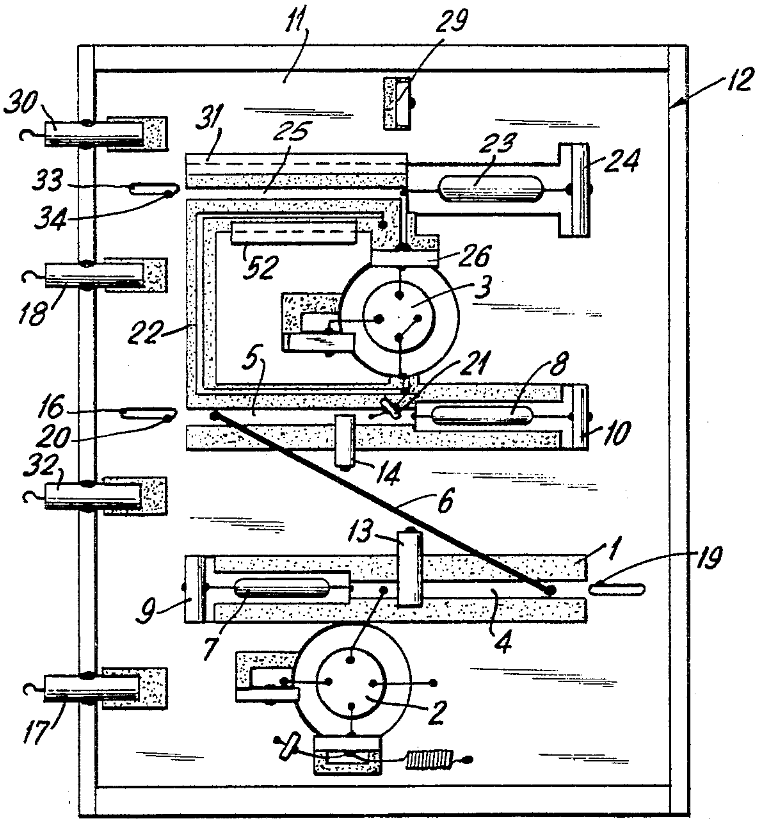
FIG. 2 is a top view of a physical embodiment of the network diagrammatically illustrated in FIG. 1.
Figure 3:
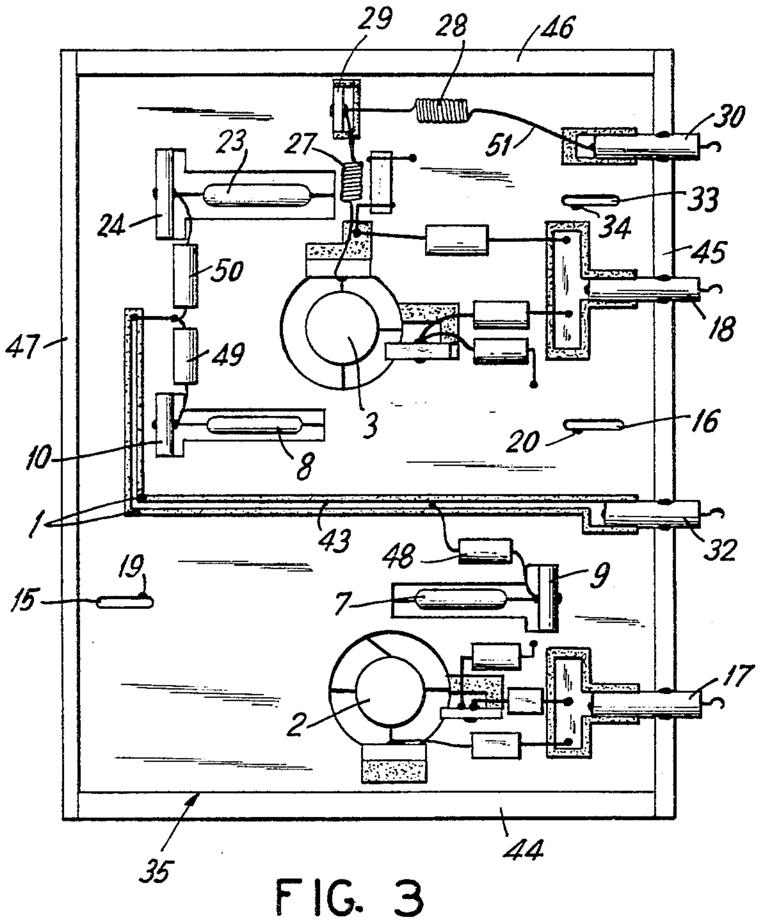
FIG. 3 is a bottom view of the structure of FIG. 2.

In FIGS. 2 and 3 we have shown the physical structure of the circuit arrangement diagrammatically illustrated in FIG. 1. A dielectric sheet 1, e.g. of plastic material or glass, supports on its upper surface a metallic layer 12 and on its lower surface a similar metallic layer 35, the two layers being conductively interconnected by peripheral metal foils 44, 45, 46 and 47. With the lower metal layer 35 assumed to be grounded, the marginal zone of layer 12 adjacent the strips 44–47 represents the ground bus bar 11 of FIG. 1. Metal layer 12 has portions omitted to expose the underlying sheet 1 and to define the loop 22 as well as strips 4, 5 and 25. These strips are in line with respective slots 15, 16 and 33 in sheet 1 disposed adjacent the junctions of these strips with the marginal layer portion 11, to allow for modification of the effective ground impedances of these junctions by means of transverse connectors 19, 20, 34 which bridge the layers 12, 35 by being soldered thereto to form the aforedescribed short-circuiting connections. The effect of these connections upon the ground impedances of the base points of strips 4, 5 and 25 depends, of course, on the chosen location of the bridge pieces within the slots 15, 16 and 33.

The condensers 13 and 14 of FIG. 1 are represented in FIG. 2 by flexible metallic tabs overhanging the free ends of strips 4, 5 respectively, these tabs being secured to the sheet 1 by being soldered onto the top layer 12. The shunt capacitances provided by the tabs 13, 14 can be varied by bending them toward or away from the associated strips 4, 5.

The bottom layer 35 is also partly omitted to define the feedback loop 43.

Figure 4:
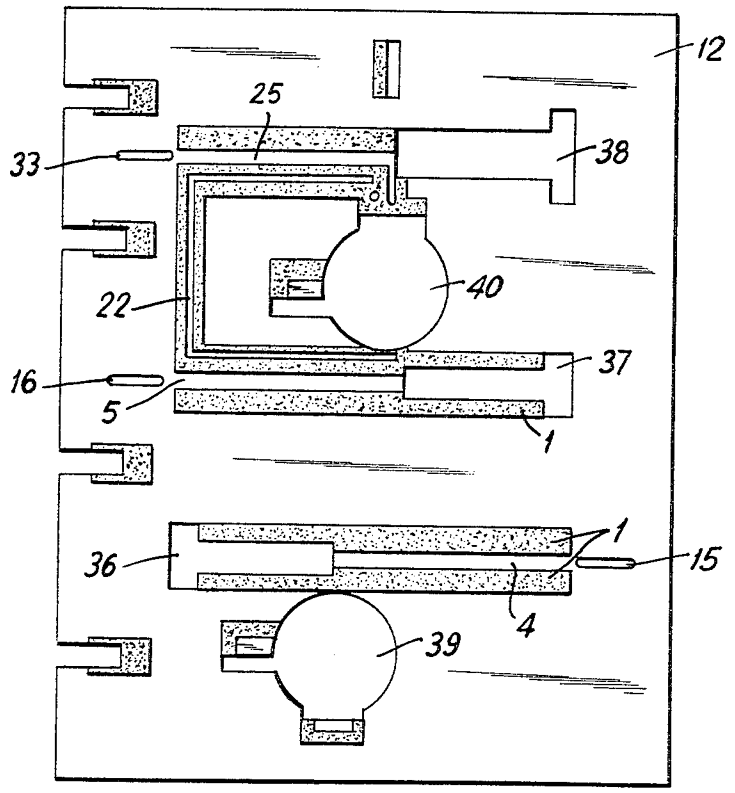
FIG. 4 is a top view, similar to FIG. 2, of the basic skeleton of that structure.
Figure 5:
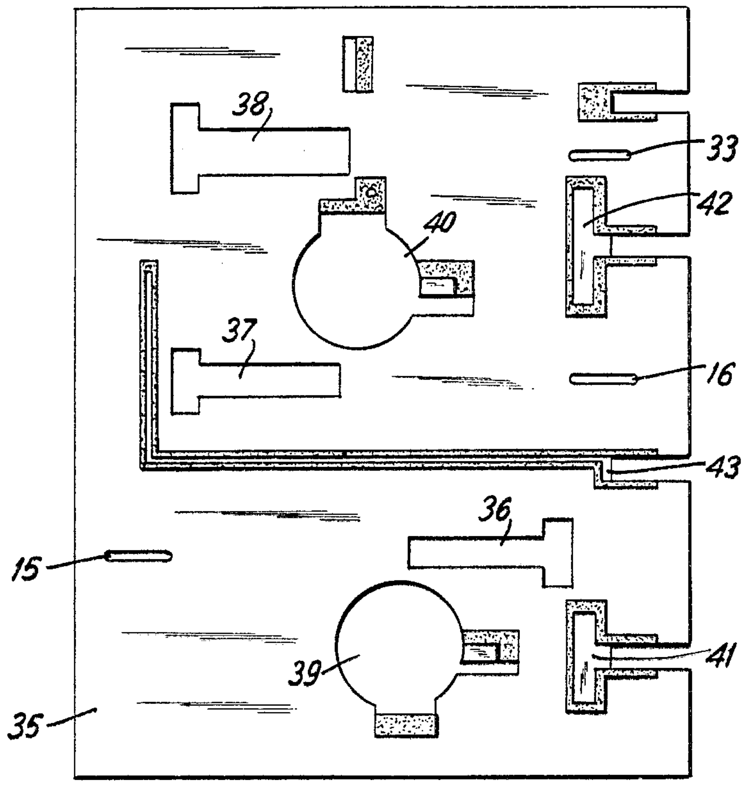
FIG. 5 is a bottom view of the skeleton, similar to FIG. 3.

As best seen in FIGS. 4 and 5, the unit 1, 12, 35 is formed with a number of peripheral and internal cutouts which may be stamped therefrom together with the slots 15, 16, 33 and which include apertures 36, 37, 38, 39 and 40 to accommodate some of these circuit elements that do not readily lend themselves to realization by printed circuits. Thus, cutouts 36–38 are generally T-shaped and hold the varactors 27, 8 and 23 together with their associated condensers 9, 10 and 24, respectively, whereas cutouts 39 and 40 respectively receive the transistors 2 and 3. The outer envelope of transistor 2 is grounded via layer portion 11 whereas that of transistor 3 is tied to its emitter and therefore to loop 22. As shown, each of these elements is held in its cutout in spaced relationship with both metal layers 12, 35 by its electrode leads which are soldered onto these layers or, in some instances, adhesively bonded to the bare sheet 1. Other impedance elements, such as the coils 27, 28, rest directly on the sheet 1 adjacent one of its metal layers instead of being held in a cutout thereof. Conductor 51 has the form of a short wire.

As also shown in FIG. 2, the effective impedance of coupling loop 22 may be varied by the provision of a metal foil or plate 52 disposed alongside a section of that loop in conductive contact with an adjacent portion of layer 12, the spacing of this foil from strip 22 determining the characteristic impedance of the loop and, therefore, the resonant frequency of the input circuit of transistor 3. Similar tuning means may, of course, also be provided for the quarter-wavelength or half-wavelength lines defined by strips 4, 5, 25 together with adjacent zones of layer 12.

Figure 6:
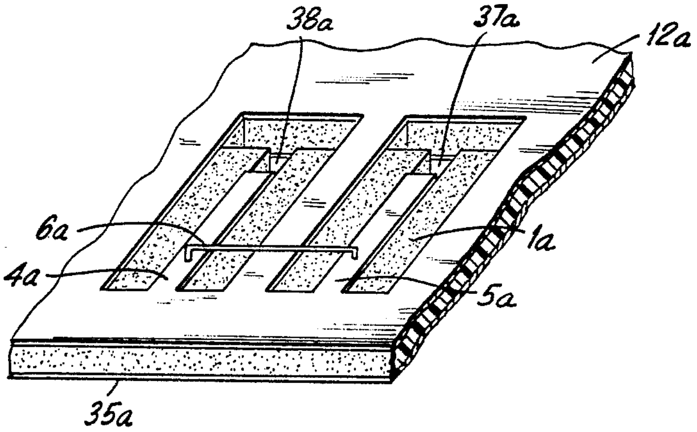
FIG. 6 is a fragmentary perspective view of a partially modified structure.
Figure 7:
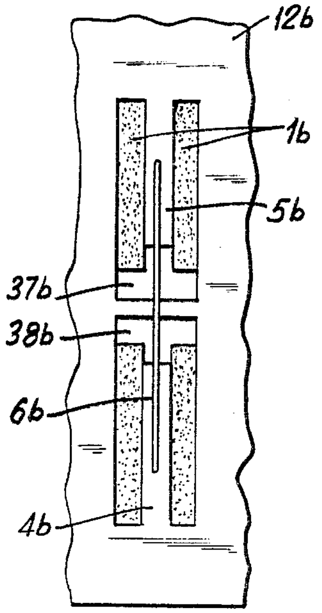
FIGS. 7 and 8 are fragmentary top views of two further modifications.
Figure 8:
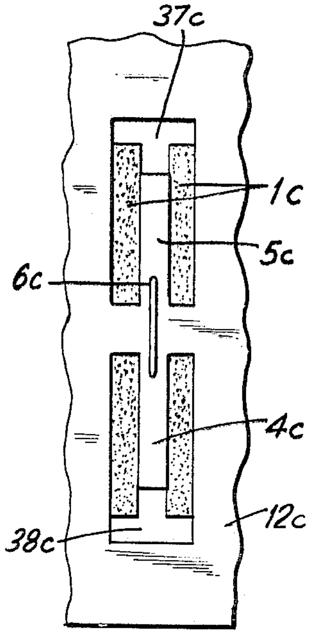

The inductance bridge 6 has been shown as a wire clip having its pointed ends stuck into the sheet 1 through parts of zones 4 and 5. As seen in FIG. 2, the strip lines formed by the zones 4, 5 and adjacent parts of layer 12 are arranged in a relatively inverted position, with the clip 6 thus extending digonally across the two circuits. As shown in FIGS. 6–8, however, the arrangement may be modified by disposing the strip lines 4*a*, 5*a* alongside each other with parallel orientation in respective cutouts 38*a* and 37*a* of a sheet 1*a* bearing layers 12*a* and 35*a*, with the wire clip 6*a* extending transversely therebetween (FIG. 6), or by mutually aligning the cutouts 37*b*, 38*b*, or 37*c*, 38*c* of a unit 1*b*, 12*b* or 1*c*, 12*c* (the lower layers being not visible) to accommodate strips 4*b*, 5*b* (FIG. 7) or 4*c*, 5*c* (FIG. 8) with either the hot or the cold ends thereof confronting each other, the corresponding wire clips having been shown at 6*b* and 6*c*, respectively. It will be noted that FIG. 7 shows a predominantly capacitive coupling and FIG. 8 a predominantly inductive coupling between the two circuits, apart from the supplemental inductance 6*b* or 6*c*.

It will thus be seen that we have provided a novel structure (FIGS. 4 and 5) which will serve as a skeleton for high-frequency networks, to be supplemented by additional circuit elements physically supported on that structure; the added elements may include conductors which can be selectively positioned to compensate for manufacturing tolerances. The means for adjustment, such as the clip 6, the tabs 13, 14 or the bridge pieces 19, 20, 34, can be omitted entirely if compensation is not required.

We claim:

1. A network for high-frequency currents, comprising a dielectric sheet provided on at least one surface with a metallic layer subdivided into conductive strip zones forming part of a reactive network, said strip zones including a first zone, a second zone spaced from said first zone but conductively connected thereto, and a third zone having interconnected portions closely juxtaposed with said first and second zones, respectively, in inductively coupled relationship; and amplifier means physically supported and removably mounted on said sheet, said amplifier means having an input electrode capacitively coupled to said first zone and an output electrode capacitively coupled to said second zone, one of said electrodes being conductively connected to said third zone, the latter forming a feedback loop between said electrodes.

2. A network as defined in claim 1, further comprising a metal foil disposed alongside one of said strip zones of said loop in partly overlapping relationship therewith for modifying the effective reactance thereof.

3. A network as defined in claim 1 wherein said network comprises a wire clip interconnecting two of said strip zones.

4. A network as defined in claim 1 wherein said amplifier means comprises a crystal semiconductor element.

5 A network as defined in claim 4 wherein said sheet is provided with a cutout accommodating said semiconductor element.

6. A network as defined in claim 4 wherein said sheet is provided with a second metallic layer opposite the first-mentioned layer, said semiconductor element being held in said cutout in spaced relationship with said layers.

7. A network as defined in claim 6 wherein said sheet is provided with at least one slot penetrated by a metallic connection between said layers.

References Cited

UNITED STATES PATENTS

| | | | |
|---|---|---|---|
| 2,751,444 | 6/1956 | Koch | 317—101 X |
| 2,796,470 | 6/1957 | Gossard | 330—66 |
| 2,876,393 | 3/1959 | Tally et al. | 339—17 X |
| 2,898,521 | 8/1959 | Creveling | 174—68.5 X |
| 2,933,704 | 4/1960 | Janssen et al. | 331—99 X |

ROY LAKE, Primary Examiner

SIEGFRIED H. GRIMM, Assistant Examiner

U.S. Cl. X.R.

331—117, 177; 332—30; 333—84; 339—17